United States Patent
Yoshizawa et al.

(10) Patent No.: US 8,662,308 B2
(45) Date of Patent: Mar. 4, 2014

(54) SUBSTRATE STORAGE TRAY

(75) Inventors: Takenori Yoshizawa, Osaka (JP); Hiroto Shibata, Sendai (JP)

(73) Assignees: Sharp Kabushiki Kaisha, Osaka (JP); Sydek Corporation, Miyagi (JP)

( * ) Notice: Subject to any disclaimer, the term of this patent is extended or adjusted under 35 U.S.C. 154(b) by 307 days.

(21) Appl. No.: 13/121,608

(22) PCT Filed: Aug. 17, 2009

(86) PCT No.: PCT/JP2009/064384
§ 371 (c)(1),
(2), (4) Date: Mar. 29, 2011

(87) PCT Pub. No.: WO2010/038553
PCT Pub. Date: Apr. 8, 2010

(65) Prior Publication Data
US 2011/0186472 A1    Aug. 4, 2011

(30) Foreign Application Priority Data

Sep. 30, 2008   (JP) .................................. 2008-253353

(51) Int. Cl.
*B65D 85/00* (2006.01)
(52) U.S. Cl.
USPC ............. 206/710; 206/454; 220/8; 211/41.18
(58) Field of Classification Search
USPC ......... 206/454, 711, 712, 832, 455, 710, 722, 206/586, 591, 557–567; 220/8; 221/208, 221/175; 183/223; 40/739, 741; 16/429
See application file for complete search history.

(56) References Cited

U.S. PATENT DOCUMENTS

| | | | | |
|---|---|---|---|---|
| 3,347,575 A | * | 10/1967 | Morris | 16/429 |
| 3,465,461 A | * | 9/1969 | Price et al. | 40/741 |
| 3,603,628 A | * | 9/1971 | Smith et al. | 403/329 |
| 3,887,102 A | * | 6/1975 | Earley | 220/8 |
| 4,277,120 A | * | 7/1981 | Drake et al. | 312/223.1 |
| 6,236,312 B1 | * | 5/2001 | Chitsazan et al. | 340/539.32 |
| 6,422,405 B1 | * | 7/2002 | Haenszel | 211/175 |
| 6,691,884 B1 | * | 2/2004 | Dwyer | 220/4.03 |
| 2004/0104139 A1 | | 6/2004 | Yoshizawa | |
| 2005/0058532 A1 | * | 3/2005 | Mashburn | 414/800 |

FOREIGN PATENT DOCUMENTS

| | | |
|---|---|---|
| CN | 1504396 A | 6/2004 |
| JP | 53-18762 U | 2/1978 |
| JP | 53-126164 U1 | 10/1978 |
| JP | 62-297518 A | 12/1987 |
| JP | 2004-186249 A | 7/2004 |
| JP | 2005-96795 A | 4/2005 |

* cited by examiner

*Primary Examiner* — Mickey Yu
*Assistant Examiner* — Chun Cheung
(74) *Attorney, Agent, or Firm* — Birch, Stewart, Kolasch & Birch, LLP

(57) ABSTRACT

A substrate storage tray that can be decreased in size for transportation. A substrate storage tray (1) for storing a large size substrate (20) includes a frame member (2) that includes a pair of first frame portions (5) opposed to each other and a pair of second frame portions (6) opposed to each other and has a frame shape, a substrate supporting member (3, 4) that has a plate shape, is disposed inside a region enclosed by the frame member (2), and is arranged to support one surface of the substrate (20), and extending portions (7) that are provided to middle portions in a long direction of the pair of first frame portions (5) and are arranged to widen a space between the pair of second frame portions (6).

7 Claims, 5 Drawing Sheets

SUBSTRATE STORAGE TRAY

TECHNICAL FIELD

The present invention relates to a substrate storage tray that is used for keeping and carrying a square or rectangular substrate such as a glass substrate that is used in a display panel such as a liquid crystal display panel.

BACKGROUND ART

In recent years, a glass substrate that is used in a display panel such as a liquid crystal display panel has been increasing in size ($8^{th}$ generation: 2160 mm by 2460 mm). For keeping and carrying such a large glass substrate in a display panel factory, a substrate storage tray disclosed in Patent Literature 1 is used, for example.

As shown in FIG. 7, each substrate storage tray 101 includes a rectangular bottom portion 101a on which a glass substrate 20 is horizontally placed, and a rim portion 101b that projects upward from the edges of the bottom portion 101a.

As shown in FIG. 7, the substrate storage trays 101 that are vertically stacked on a pallet 102 each store the glass substrates 20 with their processed surfaces 20a facing upward. The bottom portion 101a of each substrate storage tray 101 includes pin insert holes 101c that are openings into which substrate support pins (not shown) are inserted from beneath.

A description of the process of taking out the glass substrates 20 from the substrate storage trays 101 that are vertically stacked as described above is provided. First, the substrate storage trays 101 except for the lowest substrate storage tray 101 are lifted up.

Then, the substrate support pins (not shown) are inserted into the pin insert holes 101c of the lowest substrate storage tray 101 so as to raise the glass substrate 20 from the bottom portion 101a of the lowest substrate storage tray 101.

Then, the lowest glass substrate 20 that is being raised is taken out with the use of a substrate conveying arm (not shown). The lifted up substrate storage trays 101 are then lifted down. In this manner, the lowest glass substrate 20 is taken out from the lowest substrate storage tray 101. Through repetition of this process, the glass substrates 20 can be taken out one by one from the stacked substrate storage trays 101 so as to be conveyed to a given process line.

Citation List

Patent Literature
Patent Literature 1: JP 2004-186249 A

SUMMARY OF INVENTION

Solution to Problem

However, there is a concern that a future increase in the size of the substrate storage trays 101 in accordance with a further increase in the size of the glass substrates 20 could make the size of the substrate storage trays 101 greater than the maximum size of a load-carrying platform of a vehicle such as a truck and a trailer that is generally used for transporting the substrate storage trays 101 from their production site to a display panel factory.

The maximum size of a load-carrying platform of a vehicle such as a truck and a trailer that runs a general road has limitations imposed by the road traffic law. Thus, if the size of the substrate storage trays 101 exceeds the limitations, a special-purpose vehicle or a carrier helicopter that requires a special permit application should be used for transporting the substrate storage trays 101 from their production site to a display panel factory.

The cost for transporting the substrate storage trays 101 by using a special-purpose vehicle or a carrier helicopter that requires a special permit application is extremely higher than the cost for transporting the substrate storage trays 101 by using a generally used truck or trailer. The increase in the cost for transporting the substrate storage trays 101 increases the unit price of each substrate storage tray 101, which could be costly inadequate.

An object of the present invention is to overcome the problems described above and to provide a substrate storage tray that includes an extending mechanism that is arranged to bring the substrate storage tray into an unextended state so that the substrate storage tray can be accommodated in a load-carrying plat form of a generally used truck or trailer and be transported by the truck or trailer, and is arranged to bring the substrate storage tray into an extended state when the substrate storage tray stores a substrate in a display panel factory to which the substrate storage tray has been transported.

Solution to Problem

Preferred embodiments of the present invention provide a substrate storage tray for storing a large size substrate that includes a frame member that includes a pair of first frame portions opposed to each other and a pair of second frame portions opposed to each other and has a frame shape, a substrate supporting member that has a plate shape, is disposed inside a region enclosed by the frame member, and is arranged to support one surface of the substrate, and extending portions that are provided to middle portions in a long direction of the pair of first frame portions and are arranged to widen a space between the pair of second frame portions.

In the substrate storage tray having the configuration described above in which the extending portions arranged to widen the space between the pair of second frame portions are provided to the middle portions of the pair of first frame portions of the frame member of the substrate storage tray, the size of the substrate storage tray can be changed by bringing the substrate storage tray in an extended or unextended state in a longitudinal or transverse direction.

Therefore, even if the size of the substrate storage tray that is in the extended state for storing the substrate exceeds limitations of the maximum size of a load-carrying platform of a vehicle such as a truck and a trailer that runs a general road, the substrate storage tray can be brought into the unextended state so as to be accommodated in the load-carrying platform for transportation. Thus, the cost for transporting the substrate storage tray is not increased.

In the pair of first frame portions and the pair of second frame portions that define the frame member, no extending portions are provided to the pair of second frame portions, and the extending portions are provided only to the pair of first frame portions. Therefore, stiffness against warpage or bending is sufficiently achieved also when the substrate storage tray in the extended state stores the glass substrate.

It is preferable that the pair of first frame portions have a tube shape in cross section and are each split into pluralities of split first frame portions along the long direction of the pair of first frame portions, and the extending portions are arranged to bring the pair of first frame portions into an extended state along insert bars that are each incorporated in the pluralities of split first frame portions. With this configuration, the structure of the extending portions can be simplified, and stiffness against warpage or bending in the long direction of the first frame portions in the extended state can be sufficiently achieved.

It is preferable that the substrate storage tray further includes fixing mechanisms arranged to fix the pluralities of split first frame portions and the insert bars in the pluralities of first split frame portions. With this configuration, the extended state of the first frame portions can be maintained.

It is preferable that the fixing mechanisms include screws arranged to fix side surfaces of the pluralities of split first frame portions and side surfaces of the insert bars in the pluralities of split first frame portions. With this configuration, the extended state of the first frame portions can be easily achieved only by tightening the screws.

It is preferable that the fixing mechanisms include engaging members that are movable forward and backward with respect to the side surfaces of the insert bars and are arranged to engage with engaging holes that are openings on the side surfaces of the pluralities of split first frame portions. With this configuration, the extended state of the first frame portions can be maintained only by bringing the first frame portions into the extended state by the extending portions.

It is preferable that the substrate supporting member bridges the pair of first frame portions. With this configuration, the structure of the substrate supporting member can be simplified because no extending portions are provided to the substrate supporting member similar to the second frame portions, and reduction of stiffness of the substrate supporting member can be prevented.

It is preferable that the substrate supporting member includes a reinforcing member that is arranged to reinforce mechanical strength of the substrate supporting member and bridges the pair of first frame portions. With this configuration, stiffness of the substrate supporting member can be improved, and thickness and weight of the substrate supporting member can be reduced.

Advantageous Effects of Invention

The substrate storage tray having the configurations described above can be brought into the unextended state at the time of transportation so that the substrate storage tray can be accommodated in a load-carrying platform of a generally used truck or trailer that runs a general road and be transported by the track or trailer. In addition, the substrate storage tray having the configurations described above can be brought into the extended state at the time of storing a glass substrate in a display panel factory to which the substrate storage tray has been transported. Thus, the cost for transporting the substrate storage tray is not increased. In addition, the substrate storage tray can maintain the abilities of keeping and carrying the stored glass substrate.

BRIEF DESCRIPTION OF DRAWINGS

FIG. 1A is a plan view, and FIG. 1B is a side view.

FIG. 2A is a plan view, and FIG. 2B is a side view.

DESCRIPTION OF EMBODIMENTS

A detailed description of a preferred embodiment of the present invention will now be provided with reference to the accompanying drawings.

Figure 1A:
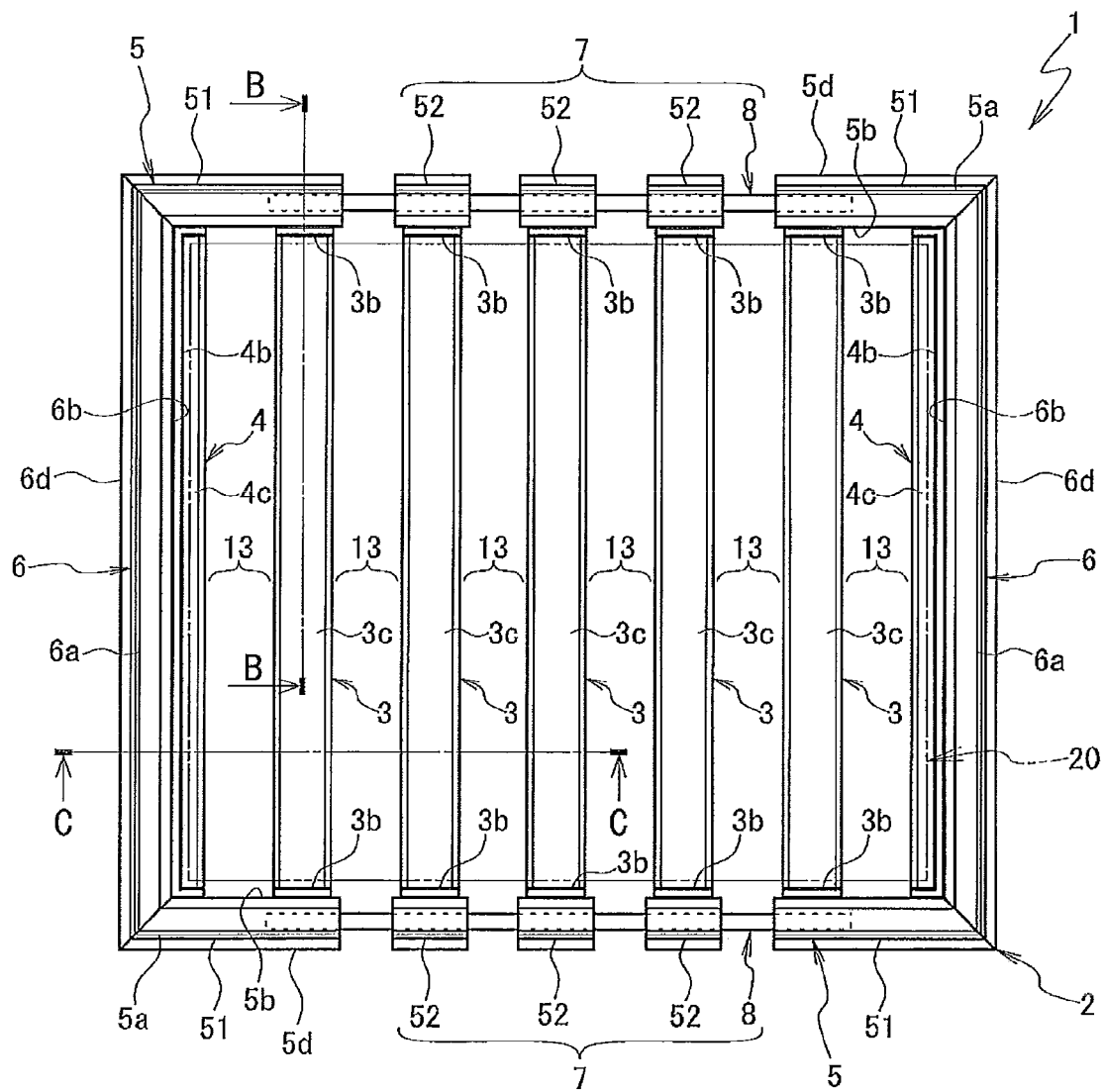
FIGS. 1A and 1B are views showing a schematic configuration of a substrate storage tray according to a preferred embodiment of the present invention in an extended state.
Figure 1B:
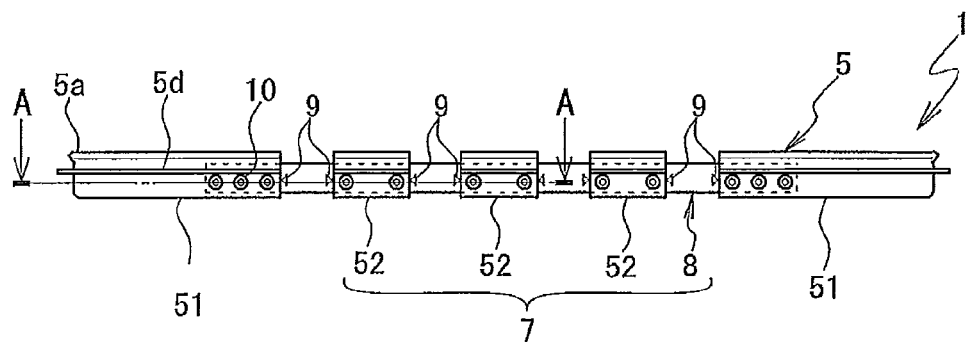
Figure 2A:
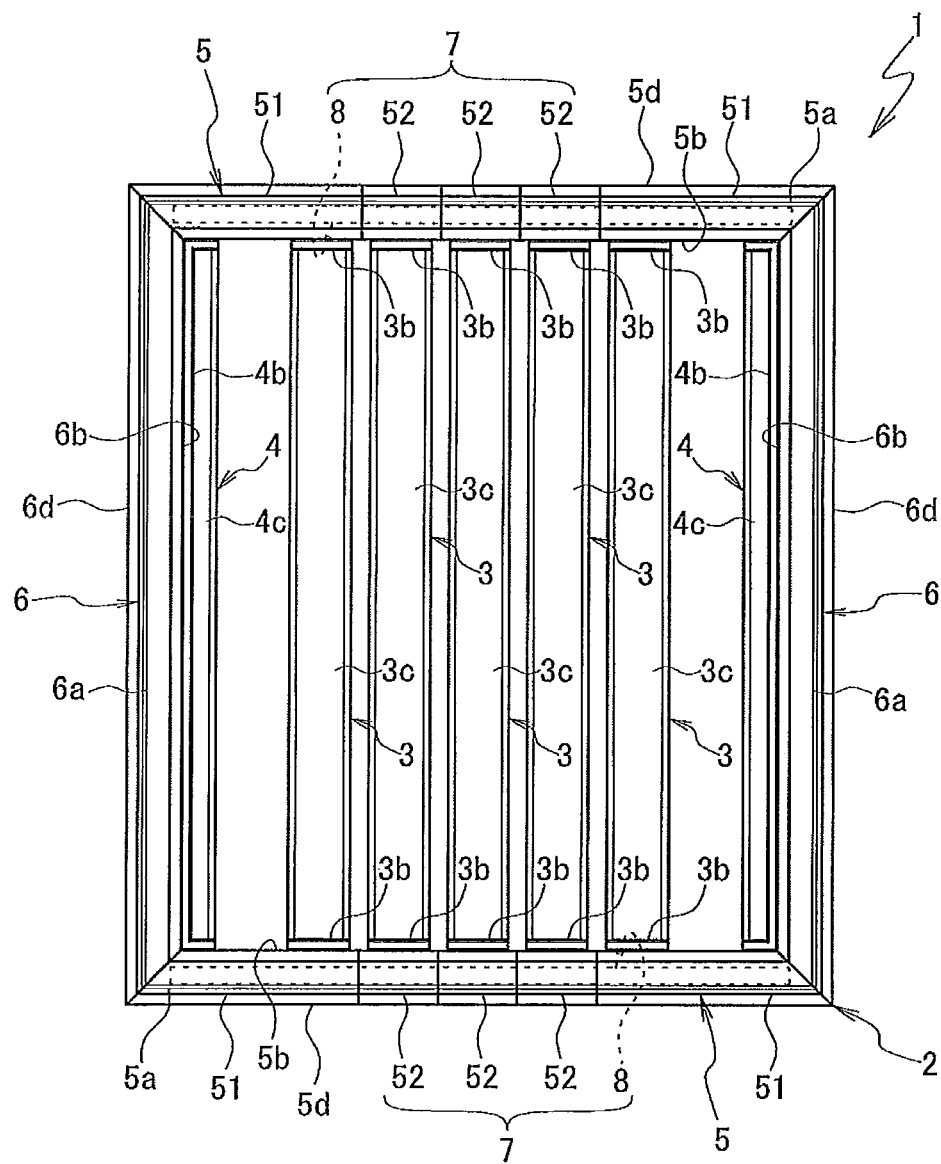
FIGS. 2A and 2B are views showing a schematic configuration of the substrate storage tray shown in FIGS. 1A and 1B in an unextended state.
Figure 2B:
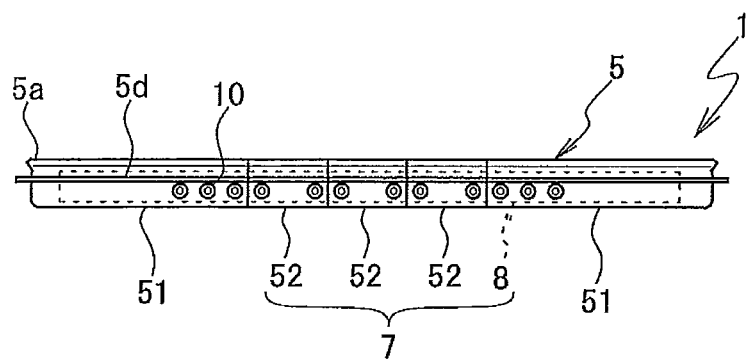

FIGS. 1A and 1B are views showing a schematic configuration of a substrate storage tray according to the preferred embodiment of the present invention in an extended state. FIG. 1A is a plan view, and FIG. 1B is a side view. FIGS. 2A and 2B are views showing a schematic configuration of the substrate storage tray shown in FIGS. 1A and 1B in an unextended state. FIG. 2A is a plan view, and FIG. 2B is a side view.

Figure 3A:
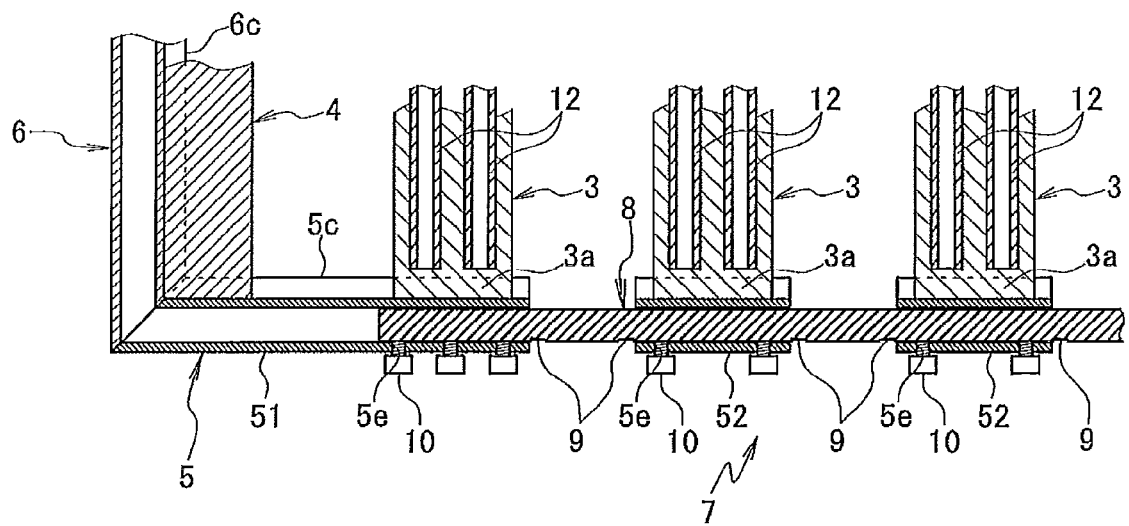
FIG. 3A is a cross-sectional view along the line A-A in FIG. 1B.
Figure 3B:
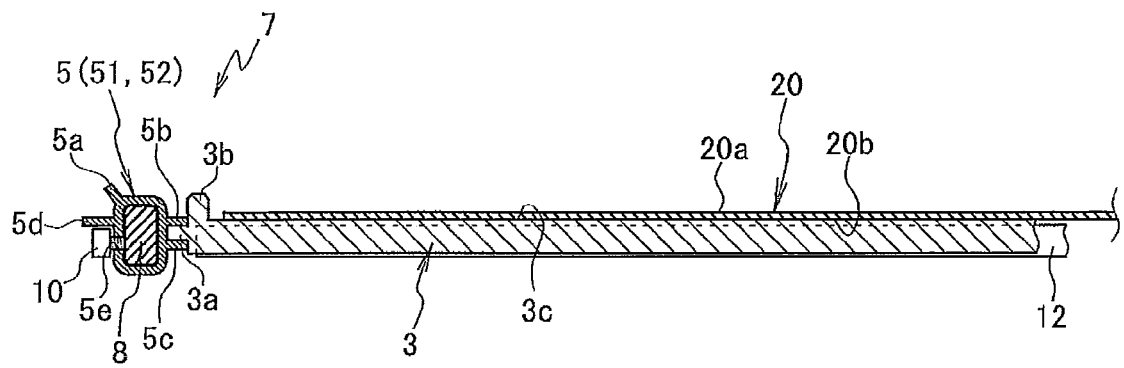
FIG. 3B is a cross-sectional view along the line B-B in FIG. 1A.
Figure 3C:
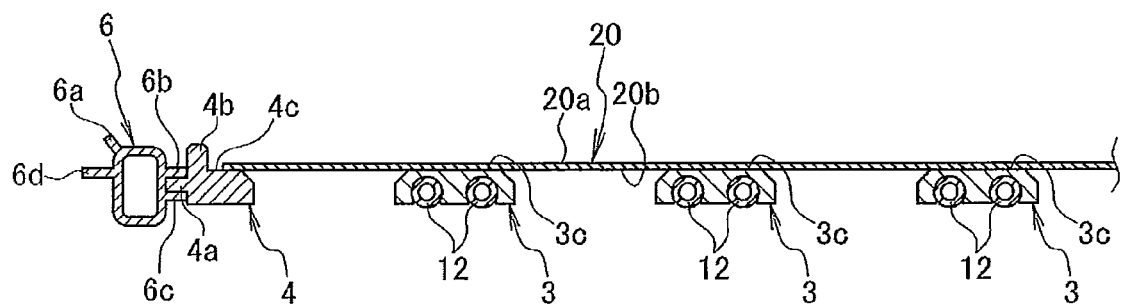
FIG. 3C is a cross-sectional view along the line C-C in FIG. 1A.
Figure 4:
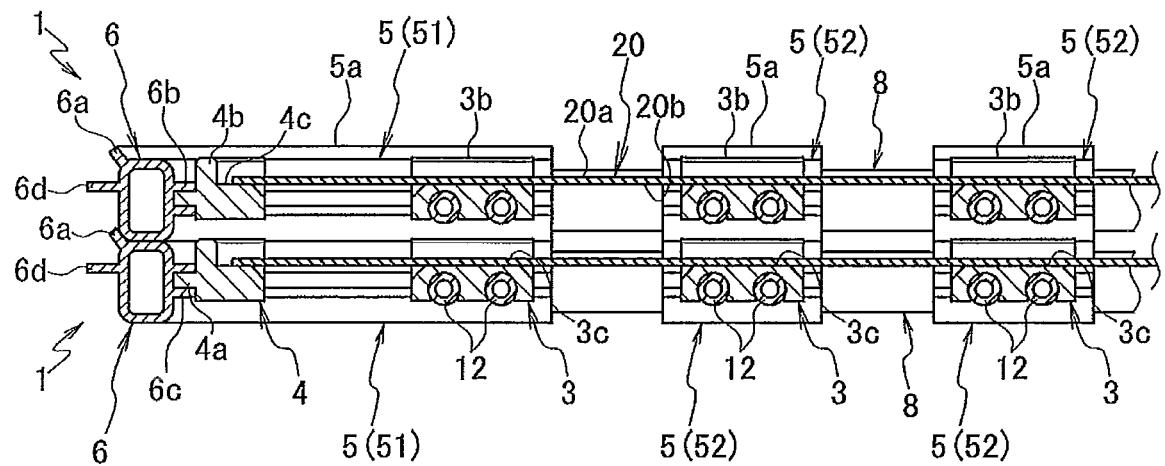
FIG. 4 is a cross-sectional view showing the substrate storage trays being vertically stacked.

FIG. 3A is a cross-sectional view along the line A-A in FIG. 1B, FIG. 3B is a cross-sectional view along the line B-B in FIG. 1A, and FIG. 3C is a cross-sectional view along the line C-C in FIG. 1A. FIG. 4 is a cross-sectional view showing the substrate storage trays being vertically stacked.

As shown in the drawings, a substrate storage tray 1 is arranged to store a rectangular glass substrate 20 that is used in a display panel such as a liquid crystal display panel, and is used for keeping and carrying the glass substrate 20. When the substrate storage tray 1 before storing the glass substrate 20 is singly carried, the substrate storage tray 1 can be decreased in size.

The substrate storage tray 1 includes a frame member 2 that is larger than the outside shape of the glass substrate 20 to be stored therein, and substrate supporting members 3 and 4 having a plate shape are disposed inside a region enclosed by the frame member 2.

The frame member 2 includes a pair of first frame portions 5 that are opposed to each other so as to be parallel to each other, and a pair of second frame portions 6 that are opposed to each other so as to be parallel to each other. The second frame portions 6 form right angles with the first frame portions 5. The ends of the first frame portions 5 and the ends of the second frame portions 6 are coupled to one another, so that the frame member 2 has a rectangular frame shape.

The substrate supporting members 3 and 4 on which the glass substrate 20 is placed are plate-shaped members that are preferably made from a foamable resin having elasticity and have a given thickness. As shown in FIGS. 1A and 1B, the five substrate supporting members 3 are disposed along the long direction of the first frame portions 5 and bridge the first frame portions 5. The two substrate supporting members 4 are each provided inside the second frame portions 6.

As shown in FIG. 3B that is a cross-sectional view along the line B-B in FIG. 1A, a frame engaging portion 3a arranged to engage with inside surfaces of the first frame portion 5 is provided to an end of the substrate supporting member 3. The top surface and the under surface of the frame engaging member 3a are parallel to each other, so that the frame engaging member 3a has a uniform thickness.

An upward projecting portion 3b is provided to the substrate supporting member 3 above the frame engaging portion 3a. A horizontal substrate placement surface 3c on which the glass substrate 20 is placed is provided to an inner area of the substrate supporting member 3 that is located on an opposite side of the substrate supporting member 3 from the frame engaging portion 3a with respect to the projecting portion 3b. The horizontal substrate placement surface 3c is positioned slightly higher than the top surface of the frame engaging portion 3a and lower than the top surface of the projecting portion 3b.

As shown in FIG. 3C that is a cross-sectional view along the line C-C in FIG. 1A, a frame engaging portion 4a arranged to engage with inside surfaces of the second frame portion 6 is provided to a longer outer edge of the substrate supporting member 4. The top surface and the under surface of the frame engaging member 4a are parallel to each other, so that the frame engaging member 4a has a uniform thickness.

An upward projecting portion 4b is provided to the substrate supporting member 4 above the frame engaging portion 4a. A horizontal substrate placement surface 4c on which the glass substrate 20 is placed is provided to an inner area of the substrate supporting member 4 that is located on an opposite side of the substrate supporting member 4 from the frame engaging portion 4a with respect to the projecting portion 4b. The horizontal substrate placement surface 4c is positioned slightly higher than the top surface of the frame engaging portion 4a and lower than the top surface of the projecting portion 4b.

The first and second frame portions 5 and 6 are hollow bodies having a substantially angled tube shape in cross section as shown in FIGS. 3B and 3C, and are preferably made from aluminum.

The top surfaces of the first and second frame portions 5 and 6 are positioned higher than the substrate placement surfaces 3c and 4c of the substrate supporting members 3 and 4, and the under surfaces of the first and second frame portions 5 and 6 are positioned lower than the under surfaces of the substrate supporting members 3 and 4. Obliquely projecting portions 5a and 6a project from the top surfaces of the first and second frame portions 5 and 6 outwardly obliquely, and the top ends of the obliquely projecting portions 5a and 6a are positioned higher than the top surfaces of the projecting portions 3b and 4b of the substrate supporting members 3 and 4. The under surfaces of the first and second frame portions 5 and 6 are positioned lower than the under surfaces of the substrate supporting members 3 and 4.

Horizontal top surface engaging portions 5b and 6b having a strip shape are provided to the inner side surfaces of the first and second frame portions 5 and 6 along all the inner perimeters of the first and second frame portions 5 and 6, and are arranged to be in contact with the top surfaces of the frame engaging portions 3a and 4a of the substrate supporting members 3 and 4. Horizontal under surface engaging portions 5c and 6c having a strip shape are provided to the inner side surfaces of the first and second frame portions 5 and 6 along all the inner perimeters of the first and second frame portions 5 and 6, and are arranged to be in contact with the under surfaces of the frame engaging portions 3a and 4a of the substrate supporting members 3 and 4. The frame engaging portions 3a and 4a of the substrate supporting members 3 and 4 are caught between the top surface engaging portions 5b and 6b and the under surface engaging portions 5c and 6c and are fixedly engaged by means of rivets or screws (not shown).

Flange portions 5d and 6d that project horizontally outward are provided to the outer side surfaces of the first and second frame portions 5 and 6 along all the outer perimeters of the first and second frame portions 5 and 6 at the same heights as the top surface engaging portions 5b and 6b. The flange portions 5d and 6d are used for chucking by a chucking device at the time of lifting the substrate storage tray 1 for transportation or taking out the glass substrate 20.

The substrate storage tray 1 has a vertically stackable structure. At the time of vertically stacking the substrate storage trays 1, as shown in FIG. 4, the under surfaces of the first and second frame portions 5 and 6 of the upper substrate storage tray 1 are fixed inside the obliquely projecting portions 5a and 6a on the top surfaces of the first and second frame portions 5 and 6 of the lower substrate storage tray 1. The obliquely projecting portions 5a and 6a of the lower substrate storage tray 1 prevent the upper substrate storage tray 1 from moving horizontally.

Extending portions 7 arranged to widen the space between the second frame portions 6 are provided to middle portions of the first frame portions 5 of the substrate storage tray 1. An insert bar 8 is incorporated in the hollow of the first frame portion 5 as shown in FIGS. 3A and 3B. The insert bar 8 is a square timber that is preferably made from aluminum and has chamfered corners. The outer diameter of the insert bar 8 is slightly smaller than the inner diameter of the hollow of the first frame portion 5.

The first frame portion 5 is split into five portions. The five portions consist of split first frame portions 51 on each end, and three split first frame portions 52 provided between the split first frame portions 51. The extending portion 7 is constituted of the three split first frame portions 52 and the insert bar 8. The insert bars 8 have such a length that the insert bars 8 can be accommodated in the hollows of the first frame portions 5 in the unextended state as shown in FIG. 2A.

When the first frame portion 5 is brought into the extended state by the extending portion 7, the split first frame portions 51 are positioned at both ends of the insert bar 8 as shown in FIGS. 1B and 3A, and the split first frame portions 52 are spaced in a middle portion in the long direction of the insert bar 8 as shown in FIGS. 1B and 3A. To be specific, one of the split first frame portion 52 is positioned at the center of the insert bar 8, and the other split first frame portions 52 are positioned at a given distance from the center of the insert bar 8 on both sides.

A plurality of triangular locating marks 9 are provided to the outer side surface of the insert bar 8. The locating marks 9 are dent portions and are colored with paint. Location of the split first frame portions 51 and 52 is performed with reference to the locating marks 9.

The split first frame portions 51 and 52 are fixed to the insert bar 8 by inserting fixing screws 10 into screw holes 5e in the outer side surfaces of the split first frame portions 51 and 52, and pushing and engaging the ends of the fixing screws 10 against the outer side surface of the insert bar 8.

In the preferred embodiment of the present invention, three fixing screws 10 are used for fixing each split first frame portion 51 to each end portion of the insert bar 8, and two fixing screws 10 are used for fixing each split first frame portion 52 to the insert bar 8.

A description of the process of bringing the substrate storage tray 1 from the unextended state shown in FIGS. 2A and 2B into the extended state shown in FIGS. 1A and 1B is specifically provided. The left split first frame portion 51 in the unextended state shown in FIGS. 2A and 2B is relatively moved leftward with respect to the insert bar 8 as shown in FIGS. 1B and 3A.

Then, the right end of the moved split first frame portion 51 is located at the first locating mark 9 from the left of the insert bar 8. The ends of the three fixing screws 10 are inserted through the split first frame portion 51 so as to be pushed against the outer side surface of the insert bar 8, so that the split first frame portion 51 is fixed at a give position in the left end portion of the insert bar 8.

Then, the left one of the three split first frame portions 52 in the unextended state shown in FIGS. 2A and 2B is relatively moved leftward respect to the insert bar 8. The moved split first frame portion 52 is located between the second and third locating marks 9 from the left of the insert bar 8. The ends of the two fixing screws 10 are inserted through the split first frame portion 52 so as to be pushed against the outer side surface of the insert bar 8, so that the split first frame portion 52 is fixed at a give position of the insert bar 8. The other split first frame portions 51 and 52 undergo the same process. As a result, the substrate storage tray 1 is brought from the unextended state shown in FIGS. 2A and 2B into the extended state shown in FIGS. 1A and 1B.

It is not necessary to move the center one of the three split first frame portions 52. Thus, it is preferable to fix the center split first frame portion 52 to the insert bar 8 by using the fixing screws 10 in advance.

Figure 5:
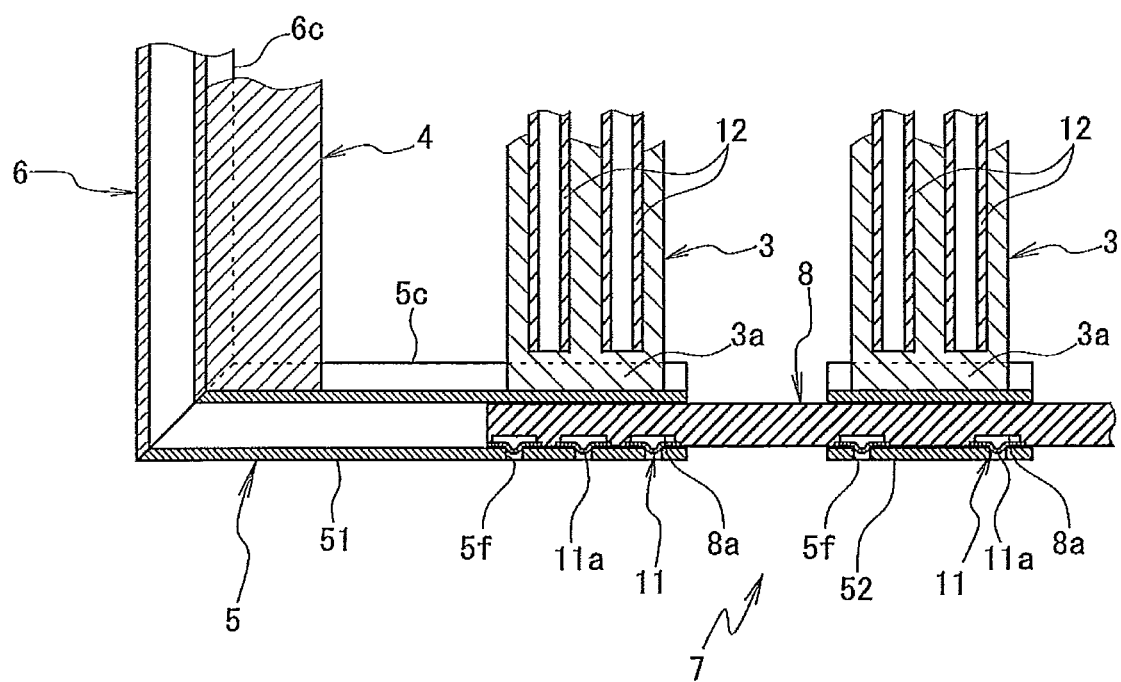
FIG. 5 is a view showing a modified example of the structure of an extending portion shown in FIG. 3A.

The mechanism of fixing the split first frame portions 51 and 52 to the insert bar 8 may have a configuration such that engaging members 11 are attached to the outer side surface of the insert bar 8, the engaging members 11 are movable forward and backward with respect to the outer side surface of the insert bar 8, and the engaging members 11 engage in engaging holes 5f that are openings that penetrate the split first frame portions 51 and 52, as shown in FIG. 5.

The engaging members 11 are preferably plate springs having elasticity. Each engaging member 11 has an engaging portion 11a that is curved outward at a substantially center position of the engaging member 11. Accommodate portions 8a are depressions that are provided in the outer side surface of the insert bar 8. Both ends of each engaging member 11 are fixed at both edges of each accommodate portion 8a along the long direction of the insert bar 8. The accommodate portions 8a have a depth such that the engaging portions 11a of the engaging members 11 are warpable inward.

When the engaging portions 11a of the engaging members 11 are in contact with the inner walls of the hollow bodies of the split first frame portions 51 and 52, the engaging portions 11a are temporarily warped inward. When the engaging portions 11 are positioned at the engaging holes 5f of the split first frame portions 51 and 52, the engaging portions 11 return to the original shape and engage with the engaging holes 5f of the split first frame portions 51 and 52.

Owing to this configuration, the location and fixation of the split first frame portions 51 and 52 can be performed only by moving the split first frame portions 51 and 52 along the insert bar 8, which is simpler than the fixation of the split first frame portions 51 and 52 to the insert bar 8 by using the fixing screws 10. This configuration eliminates the use of the location marks 9.

The substrate storage tray 1 having the configuration described above in which the space between the second frame portions 6 is widened by the extending portions 7 of the first frame portions 5 is arranged to house one glass substrate 20. The glass substrate 20 is laid such that its processed surface 20a subjected to various processes for formation of electrodes and other components faces upward, and its rear surface 20b is in contact with the horizontal substrate placement surfaces 3c and 4c of the supporting members 3 and 4.

As shown in FIGS. 3A to 3C, each substrate supporting member 3 having a strip shape and bridging the first frame portions 5 includes a pair of reinforcing members 12 that extend along the long direction of the substrate supporting member 3. The reinforcing members 12 improve stiffness of the substrate supporting member 3 in order to avoid warpage or bending in the long direction of the substrate supporting member 3. The reinforcing members 12 are preferably aluminum pipes, and are embedded in the under surface of the substrate supporting member 3.

As shown in FIGS. 1A and 1B, spaces between the substrate supporting members 3 and 4 that are provided by the extension of the first frame portions 5 of the substrate storage tray 1 may define pin insert holes 13 into which substrate holding pins (not shown) are inserted.

Figure 6:
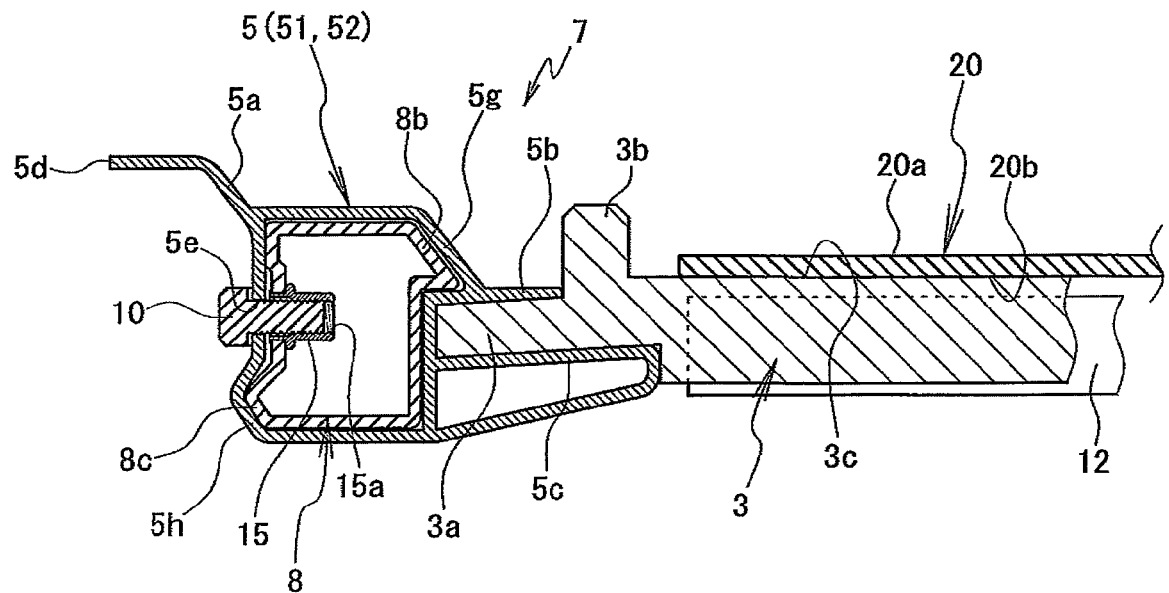
FIG. 6 is a view showing a more specific example of the structure of the extending portion shown in FIG. 3B.
Figure 7:
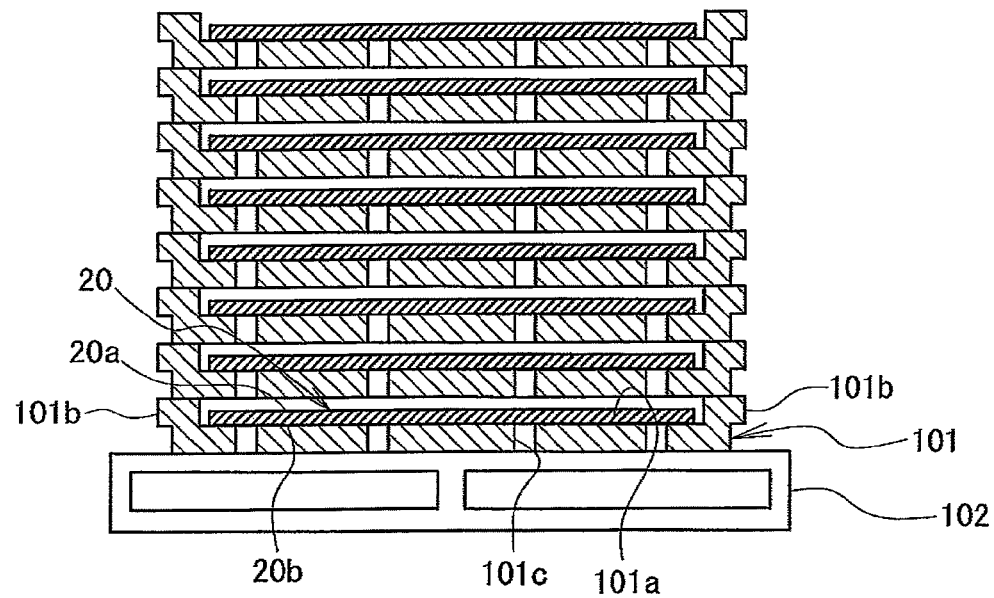
FIG. 7 is a view showing a schematic configuration of a conventionally used substrate storage tray.

A more specific example of the extending portion 7 is provided with reference to FIG. 6. Constituent elements that are shown in FIG. 3B are assigned the same numerals, and their descriptions are omitted. Descriptions of constituent elements not included in FIG. 3B are mainly provided.

As shown in FIG. 6, the insert bar 8 is a hollow body having a substantially angled tube shape in cross section, and are preferably made from aluminum. A reinforcing rib 8b is a projecting portion that is provided to an upper portion on the inner side surface of the insert bar 8 and extends along the long direction of the insert bar 8. A reinforcing rib 8c is a projecting portion that is provided to a lower portion on the outer side surface of the insert bar 8 and extends along the long direction of the insert bar 8. The reinforcing ribs 8b and 8c are provided at different heights. The reinforcing ribs 8b and 8c improve stiffness against warpage or bending in the long direction of the insert bar 8. The split first frame portions 51 and 52 that are hollow bodies in which the insert bar 8 is incorporated have cross-sectional shapes that conform to the shapes of the reinforcing ribs 8b and 8c of the insert bar 8, and are provided with reinforcing ribs 5g and 5h that are projecting portions and are provided at different heights similar to the reinforcing ribs 8b and 8c. Thus, the reinforcing ribs 5g and 5h improve stiffness against warpage or bending in the long direction of the split first frame portions 51 and 52.

In the configuration of FIG. 3B, the split first frame portions 51 and 52 are fixed to the insert bar 8 by inserting the fixing screws 10 into the screw holes 5e in the outer side surfaces of the split first frame portions 51 and 52, and pushing and engaging the ends of the fixing screws 10 against the outer side surface of the insert bar 8. In the configuration of FIG. 6, the split first frame portions 51 and 52 are fixed to the insert bar 8 by inserting the fixing screws 10 into screw holes 15a of cap nuts 15 provided in the outer side surface of the insert bar 8. This configuration reinforces the fixation of the split first frame portions 51 and 52 to the insert bar 8 by using the fixing screws 10 in the extended state.

The substrate storage tray 1 described above that includes the extending portions 7 that are arranged to widen the space between the second frame portions 6 and are provided at the middle portions in the long direction of the first frame portions 5 of the frame member 2 can be changed in size by being extended or unextended horizontally.

Therefore, even if the size of the substrate storage tray 1 in the extended state for storing the glass substrate 20 in FIG. 1 exceeds the maximum size of a load-carrying platform of a vehicle such as a truck and a trailer that runs a general road, the cost for transporting the substrate storage trays 1 is not increased because the substrate storage tray 1 can be decreased in size so as to be brought into the unextended state shown in FIGS. 2A and 2B and accommodated in the load-carrying platform for transportation.

In the first frame portions 5 and the second frame portions 6 that define the frame member 2, no extending portions are provided to the second frame portions 6, and the extending portions 7 are provided only to the middle portions of the first frame portions 5. Thus, stiffness against warpage or bending is sufficiently achieved also after the glass substrate 20 is stored in the substrate storage tray 1 in the extended state.

Owing to the configuration that the first frame portions 5 have a tube shape in cross section and the extending portions 7 are arranged to bring the first frame portions 5 into the extended state along the insert bars 8 that are incorporated in the split first frame portions 51 and 52 that are arranged along the long direction of the first frame portions 5, the structure of the extending portions 7 can be simplified, and stiffness against warpage or bending in the long direction of the first frame portions 5 in the extended state is sufficiently achieved.

With the extending portions 7 of the first frame portions 5 having the configuration that the fixation of the first frame portions 5 to the insert bars 8 incorporated therein is performed by using the fixing screws 10 as shown in FIG. 3A or FIG. 6, the extended state of the first frame portions 5 can be easily maintained only by tightening the fixing screws 10.

The fixation of the first frame portions 5 to the insert bars 8 may be performed such that the engaging members 11 that are movable forward and backward with respect to the outer side surfaces of the insert bars 8 engage in the engaging holes 5f on the side surfaces of the first frame portions 5. In this case, the extended state of the first frame portions 5 can be maintained only by bringing the first frame portions 5 into the extended state by the extending portions 7.

The substrate supporting members 3 and 4 bridge the first frame portions 5, and no extending portions are provided to the substrate supporting members 3 and 4 similar to the second frame portions 6. Therefore, the structure of the substrate supporting members 3 and 4 can be simplified, and reduction of stiffness of the substrate supporting members 3 and 4 can be prevented.

Owing to the reinforcing members 12 that are arranged to reinforce mechanical strength of the substrate supporting members 3 and bridge the first frame portions 5, stiffness of the substrate supporting members 3 is improved, and thickness and weight of the substrate supporting members 3 can be reduced.

While preferred embodiments of the present invention have been described above, it is to be understood that variations and modifications will be apparent to those skilled in the art without departing from the scope and spirit of the present invention.

Although the glass substrate 20 is stored in the substrate storage tray 1 in the extended state shown in FIGS. 1A and 1B, a glass substrate that is smaller than the glass substrate 20 may be stored in the substrate storage tray 1 in the unextended state shown in FIGS. 2A and 2B. Using the substrate storage tray 1 according to the extended state and the unextended state allows the substrate storage tray 1 to store a plurality of kinds of glass substrates of different sizes.

The configuration of the extending portions 7 in the middle portions of the first frame portions 5 and the method of fixing the first frame portions 5 to the insert bars 8 are neither limited, and various configurations of the extending portions 7 and various fixing methods may be used. Although each first frame portion 5 is split into five portions in the above descriptions, the number of split portions is not specifically limited.

The invention claimed is:

1. A substrate storage tray for storing a large size substrate, the substrate storage tray comprising:
   a frame member that comprises a pair of first frame portions opposed to each other and a pair of second frame portions opposed to each other and has a frame shape; and
   three or more substrate supporting members each of which has a plate shape, is disposed inside a region enclosed by the frame member, and is arranged to support one surface of the substrate, wherein
   the pair of first frame portions are each split into a group of three or more split first frame portions along a long direction of the pair of first frame portions, the three or more split first frame portions having identical cross-sectional shapes and being movable along the long direction of the pair of first frame portions;
   respective groups of the three or more split first frame portions consist of two terminal split first frame portions and one or more central split first frame portions provided between the two terminal split first frame portions, the two terminal split first frame portions each connected to one of the second frame portions;
   respective pairs of the terminal split first frame portions and respective pairs of the central split first frame portions are bridged by the substrate supporting members;
   a space between the pair of second frame portions is varied by varying spaces between each adjacent split first frame portions, the space between the pair of second frame portions being smallest when all of the three or more split first frame portions composing each of the pair of first frame portions contact mutually, and widen when the spaces between each adjacent split first frame portions are widened.

2. The substrate storage tray according to claim 1, wherein the three or more split first frame portions have a tube shape in cross section and the spaces between each adjacent split first frame portions are varied by moving the three or more split first frame portions along insert bars that are each incorporated in the three or more split first frame portions.

3. The substrate storage tray according to claim 2, further comprising fixing mechanisms arranged to fix the three or more split first frame portions and the insert bars in the three or more split first frame portions.

4. The substrate storage tray according to claim 3, wherein the fixing mechanisms comprise screws arranged to fix side surfaces of the three or more split first frame portions and side surfaces of the insert bars in the three or more split first frame portions.

5. The substrate storage tray according to claim 3, wherein the fixing mechanisms comprise engaging members that are movable forward and backward with respect to the side surfaces of the insert bars and are arranged to engage with engaging holes that are openings on the side surfaces of the three or more split first frame portions.

6. The substrate storage tray according to claim 1, wherein the substrate supporting member comprises a reinforcing member that is arranged to reinforce mechanical strength of the substrate supporting member and bridges the pair of first frame portions.

7. The substrate storage tray according to claim 5, wherein the engaging members are plate springs having elasticity that have engaging portions curved outward of the insert bars and are fixed in accommodate portions formed as depressions in an outer side surface of the insert bars; and
   the engaging portions are in contact with inner walls of hollow bodies of the three or more split first frame portions with warped inward of the accommodate portions and engage with the engaging holes with returning to original shapes.

\* \* \* \* \*